United States Patent [19]

Baliga

[11] Patent Number: 5,434,435
[45] Date of Patent: Jul. 18, 1995

[54] TRENCH GATE LATERAL MOSFET

[75] Inventor: B. Jayant Baliga, Raleigh, N.C.

[73] Assignee: North Carolina State University, Raleigh, N.C.

[21] Appl. No.: 238,222

[22] Filed: May 4, 1994

[51] Int. Cl.[6] .................. H01L 27/085; H01L 27/088; H01L 27/105

[52] U.S. Cl. .................................. 257/141; 257/332; 257/339; 257/491

[58] Field of Search ............... 257/330, 331, 332, 333, 257/334, 401, 622, 623, 487, 489, 491, 141, 139, 140, 329, 339

[56] References Cited

U.S. PATENT DOCUMENTS 5,142,640  8/1992  Iwamatsu ........................... 257/332

FOREIGN PATENT DOCUMENTS 0173371  7/1988  Japan ................................... 257/332

Primary Examiner—Robert P. Limanek
Assistant Examiner—Wael M. Fahmy
Attorney, Agent, or Firm—Richard E. Jenkins

[57] ABSTRACT

A trench gate lateral MOSFET structure has the voltage supported along side walls and the bottom surface of the trench. With narrow source and drain mesa regions that are optimally doped, a uniform electric field is obtained vertically in the mesa regions and horizontally at the bottom of the trench, allowing a relative high doping level in an N-drift region resulting in specific on-resistances well below those of conventional lateral MOSFETs at a high breakdown voltage.

21 Claims, 7 Drawing Sheets

TRENCH GATE LATERAL MOSFET

BACKGROUND OF THE INVENTION

1. Field of the Invention

This invention relates to a trench gate lateral MOSFET structure. In particular, the present invention relates to a trench gate lateral MOSFET structure that has a high breakdown voltage and specific on-resistance lower than previous structures.

2. Description of Related Art

Conventional lateral power MOSFETs have a blocking voltage supported by the extension of a depletion region from a P-base/N-drift region junction toward a drain region. By optimizing the charge in the drift region, such devices can establish a uniform electric field along the surface of the device. However, because the average value of the field in such devices is approximately $1.2 \times 10^5$ volts per centimeter, the separation between the P-base/N-drift region junction and the drain, to support a blocking voltage of 120 volts, must be approximately 10 microns. Further, because the voltage is supported laterally in the device, the cell pitch of the device is relatively large, which results in a relatively high specific on-resistance. For a breakdown voltage of 120 volts, the typical specific on-resistance of a conventional lateral power MOSFET is about 10 milliOhm-cm$^2$. The best fabricated discreet vertical channel power MOSFETs have a specific on-resistance of about 3 milliOhm-cm$^2$. Goals in the development of such power MOSFETs include reducing specific on-resistance for a given breakdown voltage while reducing the cell pitch of the device.

U.S. Pat. No. 5,142,640 to Iwamatsu discloses a lateral trench gate MOSFET. In the lateral trench gate MOSFET disclosed by Iwamatsu, the trench usually extends within a P-base region. The trench has a depth of not greater than 0.5 microns. The trench gate in such a structure is used to increase channel density and apparently does not effect the electric field distribution in the device. Iwamatsu does not have a structure that will result in uniform electric fields along the trench bottom walls. Thus, the MOSFET device of Iwamatsu is unable to obtain a high breakdown voltage.

Conventional lateral MOSFETs having such a trench gate structure suffer from a relatively high specific on-resistance at a given breakdown voltage due to non-uniform electric fields along the sidewalls and bottom of the trench. Thus, conventional trench gate lateral MOSFETs have specific on-resistance much higher than that of an ideal vertical power MOSFET.

SUMMARY OF THE INVENTION

Accordingly, it is an object of the present invention to eliminate the above described problems in the prior art.

It is a further object of the present invention to provide a trench gate lateral MOSFET structure having a specific on-resistance close to that of an ideal vertical power MOSFET and well below that of a conventional lateral MOSFET.

It is a further object of the present invention to provide such a trench gate lateral MOSFET structure where the trench gate is used to generate substantially uniform electric fields vertically along the mesa regions and horizontally along the bottom of the trench, resulting in a high breakdown voltage of the MOSFET.

It is a further object of the present invention to provide a trench gate lateral MOSFET structure having a small cell pitch compared to that of conventional lateral power MOSFETs.

To achieve the above and further objects, the present invention provides a trench gate lateral MOSFET, in which a trench extends a significant distance into an N-drift layer, which is located on one side of an intermediate layer, with a substrate on an opposite side of the intermediate layer. An oxide region is provided in the trench, with a gate region located in the oxide region. A source contact electrode is formed over an N+ layer and a P-base region on one side of the trench. A drain contact electrode is formed over an N+ layer on an opposite side of the trench. The source and drain contacts are located on a side of the N+ layer opposite from the substrate on which the intermediate layer is formed.

In this structure, the trench is much deeper than the P-base region depth. Accordingly, unlike previous devices, where the trench gate only increases the channel density, the present structure uses the trench gate to alter the electric field distribution through the N-drift region. The width of the mesa regions below the source and drain contacts is made very narrow so that there is a strong coupling of the charge in the N-drift region with the gate region along the trench side-walls. This allows a relatively high doping level in the N-drift region while producing a uniform electric field along the mesa, resulting in a high breakdown voltage and a low specific on-resistance. The device is dielectrically isolated with a thin drift layer located between the bottom of the trench and the intermediate layer, which can be an isolating oxide layer. The thickness of this drift layer is chosen so that the charge is optimized to produce a uniform electric field along the bottom of the trench.

In a second embodiment, the bottom of the trench extends into the intermediate layer and an N ion-implanted region extends around the bottom of the trench in the intermediate layer and along lower portions of the trench sidewalls in the N-drift layer. This arrangement also provides a uniform electric field along the bottom of the trench in a MOSFET having a low specific on-resistance and sufficiently high breakdown voltage.

BRIEF DESCRIPTION OF THE DRAWINGS

The above and further objects and advantages of the present invention will become clear from the following description of preferred embodiments taken in conjunction with the accompanying drawings, wherein.

DETAILED DESCRIPTION OF PREFERRED EMBODIMENTS

Figure 1:
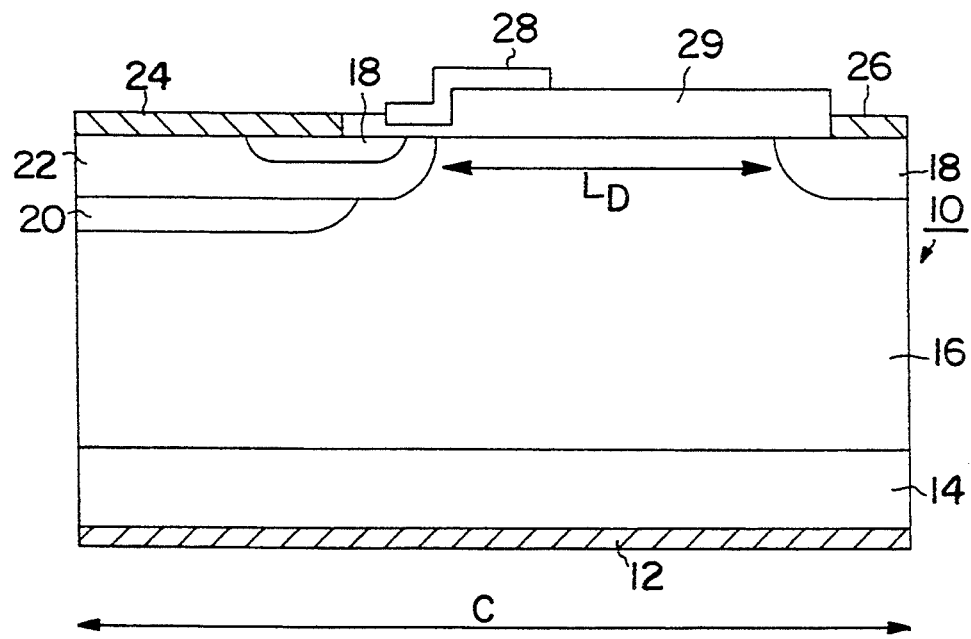
FIG. 1 is a cross-sectional view of a conventional lateral power MOSFET.

FIG. 1 is a cross-sectional view of a conventional lateral power MOSFET 10. In this structure, an intermediate layer 14 is located on a substrate layer 12. The intermediate layer is a P-substrate or an oxide layer depending upon whether the device is a junction isolation device or a dielectrically isolated device, respectively. An N-drift layer 16 is located on the intermediate layer 14. Located within the N-drift layer 16 are a P+ layer 20, a P-base layer 22 and N+ layers 18. Formed on an upper surface of the device are a source contact 24, and a drain contact 26. Located above the N-drift layer is a gate electrode 28. An oxide region 29 separates the gate electrode 28 from the source contact 24, the drain contact 26 and the N-drift layer 16. For more details on conventional lateral MOSFETS see, for example, "Analysis of the Lateral Insulated Gate Transistor," M. R. Simpson et al., IEDM, 1985, pp. 740–743, and "Lateral DMOS Power Transistor Design," S. Colak et al., IEEE Electron Device Letters, Vol. EDL-1, No. 4, Apr. 1980, pp. 51–53, the disclosures of which are incorporated herein by reference.

In the conventional lateral MOSFET structure shown in FIG. 1, the blocking voltage is supported by the length $L_D$ of a depletion region that extends from a junction between the P-base layer 22 in the N-drift layer 16 towards the drain 18. If the charge in N-drift layer 16 is optimized, an electric field can become relatively uniform along an upper surface of the device. The average value of this field has been found to be approximately $1.2 \times 10^5$ volts per centimeter. Consequently, the separation between drain 26 and the junction of the P-base layer 22 and the N-drift layer 16 must be approximately 10 μm to support a breakdown voltage of 120 volts. Since the optimum charge in the N-drift layer 16 must be $1.2 \times 10^{12}$ cm$^2$, the doping concentration in the N-drift layer 16 must be $2 \times 10^{15}$ per cm$^2$ for a typical N-drift layer thickness of 6 μm. These drift layer parameters determine the resistance between the drain and the source in the on-state. Further, because the voltage is supported laterally, the cell pitch of the device, as shown by arrow C, is relatively large. This increases the top surface area of the device, which in turn results in a larger specific on-resistance. For a breakdown voltage of 120 volts, the typical specific on-resistance of such a lateral power MOSFET is about 10 ohm-cm$^2$. Thus, such a conventional lateral power MOSFET suffers from the deficiencies of having a large cell pitch and a relatively high specific on-resistance.

Figure 2:
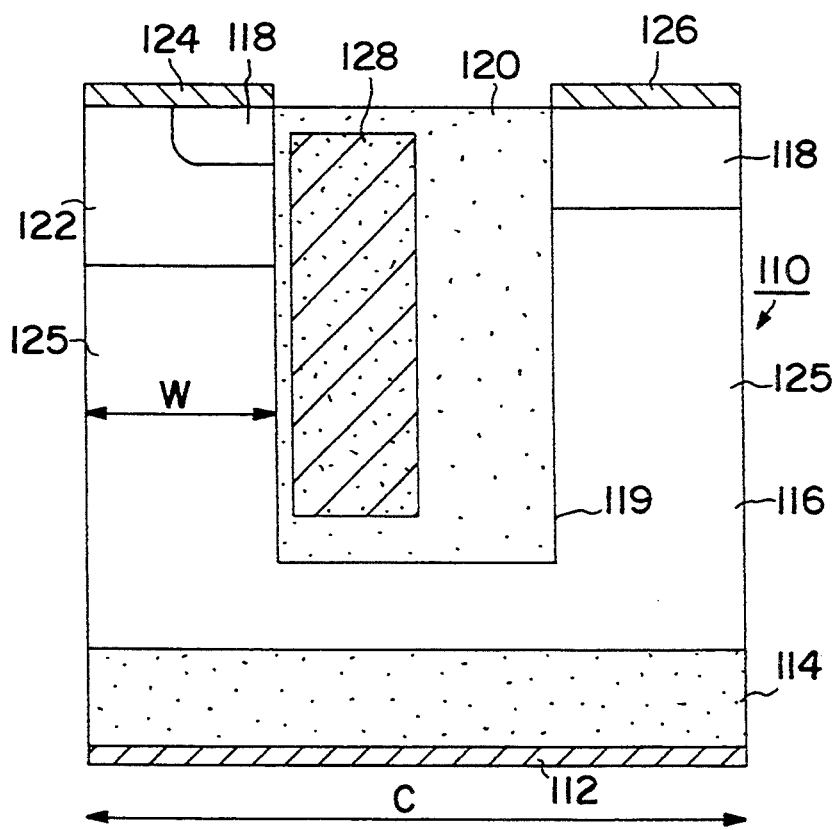
FIG. 2 is a cross-sectional view of the trench gate lateral MOSFET structure according to a preferred embodiment of the present invention.

FIG. 2 is a schematic illustration of a trench gate lateral MOSFET structure 110 according to a first preferred embodiment of the present invention. An intermediate layer 114 is located on a substrate layer 112. An N-drift layer 116 is located on the intermediate layer 114. A P-base layer 122 is located on a first portion of the N-drift layer 116 on the left side of FIG. 2. An N+ layer 118 is located on a second portion of the N-drift layer 116 on the right side of FIG. 2 and also over part of the P-base layer 122 on the left side of FIG. 2. A trench 119 is located within the N-drift layer 116, the P-base layer 122 and the N+ layer 118. An oxide region 120 is formed within the trench 119. The gate region 128 is located within the oxide region 120 in trench 119. As is well known to those of skill in the art, a gate electrode (not shown) may extend from the gate region 128 through the oxide region 120 to an area external to the MOSFET. A source contact 124 is located on the P-base layer 122 and the N+ layer 118 on a first side of the trench 119 (i.e., the left side in FIG. 2) and extends to the left edge of the trench. A drain contact 126 is located on the N+ layer on a second side of the trench 119 (i.e., the right side in FIG. 2) and extends to the right edge of the trench 119. The source contact 124 and drain contact 126 are located on an upper surface of the MOSFET 110 so as to form a lateral structure. In other words, the source contact 124 and the drain contact 126 are located on a side of the N+ layer 118 opposite from the substrate layer 112.

Figure 4D:
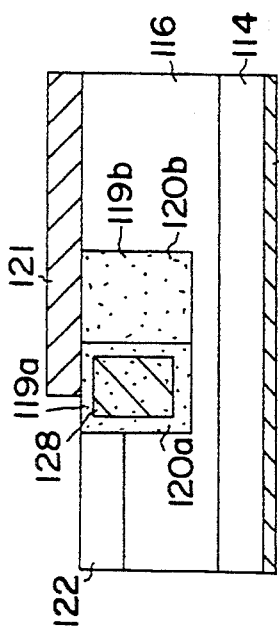
FIGS. 4a–4f are cross-sectional views of a process for manufacturing the trench gate lateral MOSFET according to a preferred embodiment of the present invention.
Figure 4E:
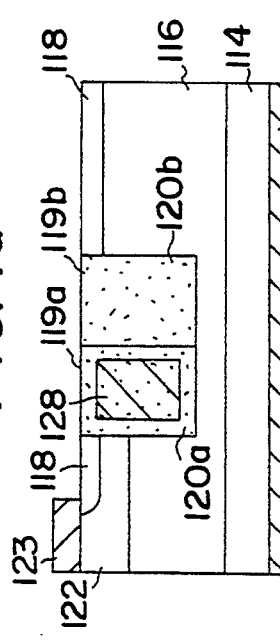
Figure 4F:
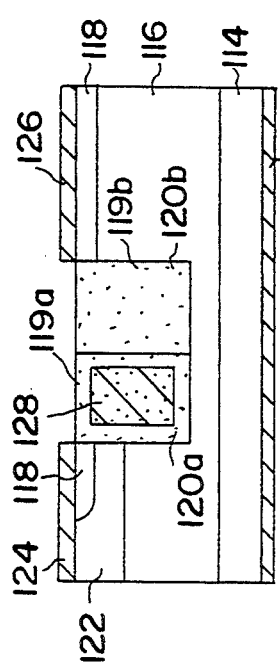
Figure 4A:
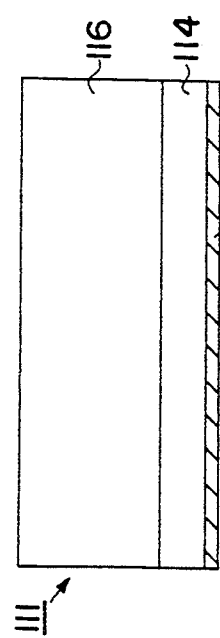

FIGS. 4a–4f are cross-sectional views showing a process by which the trench gate lateral MOSFET of FIG. 2 may be manufactured. In FIG. 4a, a starting material 111 is shown that includes a substrate 112, intermediate layer 114 and N-drift layer 116. The starting material 111 is commercially available, If a dielectrically isolated type trench gate lateral MOSFET is desired, then the substrate 112 is N or P type silicon, the intermediate layer 114 is oxide and the N-drift layer 116 is N-silicon. If a junction type trench gate lateral MOSFET is desired, then the substrate 112 is metal, the intermediate layer 114 is P-silicon and the N-drift layer is N-silicon.

Figure 4B:
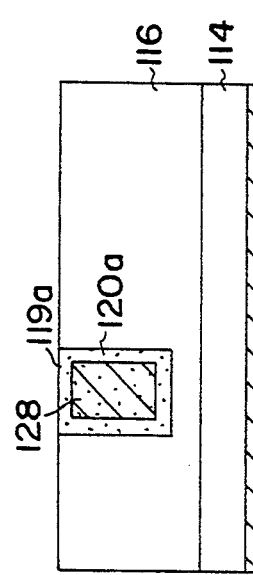

In FIG. 4b, a first trench region 119a is etched in the N-drift layer 116. Various etching processes may be used. However, a preferred etching process is Reactive Ion Etching (RIE).

A first gate oxide region 120a is formed along sidewalls and the bottom of the first trench region 119a. Then, a polysilicon gate region 128 is formed within the first oxide region 120a. Finally, a portion of the first gate oxide 120a is formed over the top of the polysilicon gate region 128.

Figure 4C:
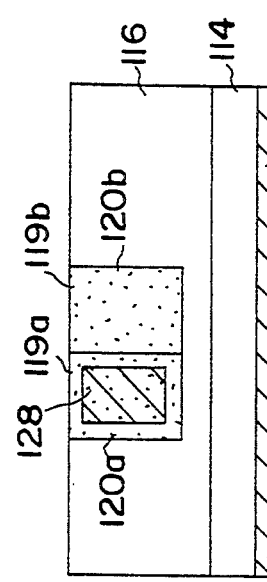

In FIG. 4c, a second trench region 119b is etched adjacent to the first trench region 119a. The second trench region 119b is filled with a second oxide region 120b.

In FIG. 4d, a first mask 121 is applied over the right side of the N-drift layer 116, the second trench region 120b and a portion of the first trench region 120a. Subsequently, a P-region 122 is diffused into the left side of the N-drift region 116. The first mask 121 is then removed.

In FIG. 4e, a second mask 123 is applied over a portion of the P-region 122. Subsequently, an N+ region 118 is diffused into the P-region 122 and into the right side of the N-drift region 116 as shown in FIG. 4e. The second mask 123 is then removed.

In FIG. 4f, the source contact 124 and the drain contact 126 are formed through well known metalization and patterning processes. A typical material for the source contact 124 and the drain contact 126 is aluminum.

The novel trench gate lateral MOSFET structure shown in FIG. 2 has a trench 119 that extends much deeper than the depth of the P-base layer 122. Trench 119 extends a large distance into the N-drift layer 116, almost reaching intermediate layer 114. Unlike conventional trench gate MOSFET devices, where the trench gate is only used to increase channel density, the trench gate of the present invention also provides a substantially uniform electric field distribution, as will be described below. Further, mesa regions 125 located between the source contact 124 and the intermediate layer 114 and between the drain contact 126 and the intermediate layer 114 are made very narrow with a width w to provide strong coupling of the dopant charge in the N-drift layer 116 with the gate region 128 along side walls of trench 119. This allows a relatively high doping level in the N-drift layer 116, using any N-type dopant. A substantially uniform electric field resulting in a high breakdown voltage of the trench gate lateral MOSFET 110 is produced if the dopant charge, equal to the product of the width W of mesa regions 125 and the doping level $N_D$ is kept between $1.0 \times 10^{12}$ cm$^{-2}$ and $2.0 \times 10^{12}$ cm$^{-2}$.

The device of FIG. 2 may be either dielectrically isolated or junction isolated. In the case of dielectric isolation, the intermediate layer 114 is an isolating oxide layer. In this case, the trench 119 is etched to a depth so that there is a thin portion of the N-drift layer 116 located between the bottom of the trench 119 and the isolating oxide layer to provide dielectric isolation. The thickness T and the doping level $N_D$ of the portion of the N-drift layer 116 between the bottom of the trench 119 and the isolating oxide layer are selected so as to produce a substantially uniform electric field along the bottom of trench 119. This is accomplished by keeping the product of the thickness T and the doping level $N_D$ of the portion of the N-drift layer 116 between the bottom of the trench 119 and the isolating oxide layer between $1.0 \times 10^{12}$ cm$^{-2}$ and $2.0 \times 10^{12}$ cm$^{-2}$.

By creating a substantially uniform electric field along the bottom and side walls of trench 119, the trench gate lateral MOSFET structure of the present invention has a high breakdown voltage. Further, because a relatively high doping concentration can be used in the N-drift layer 116, the trench gate lateral MOSFET structure of the present invention has a very low specific on-resistance comparable to that of an ideal power MOSFET.

Computer simulations of the trench gate lateral MOSFET structure of FIG. 2 were performed. In the simulations, the MOSFET had a cell pitch of 3 μm based upon 1 μm design rules, which are compatible with industry standards. The trench width was 2 μm with a trench depth of 5.5 μm. The N-drift layer 116 had a thickness of 6 μm (thus, the thickness of the N-drift layer 116 below trench 119 was 0.5 μm) and the intermediate layer 114 had a thickness of 1 μm. The N+ layer 118 had a depth of 0.5 μm and the P-base layer 122 had a depth of 1.2 μm. While the N+ layer 118 on the left and right sides of FIG. 2 appear to have different depths, it is convenient to make the depths equal during fabrication. Doping profiles were chosen to obtain a threshold voltage of 4 volts. Drift layer doping was varied to determine its effect on on-resistance and breakdown voltage.

Figure 5:
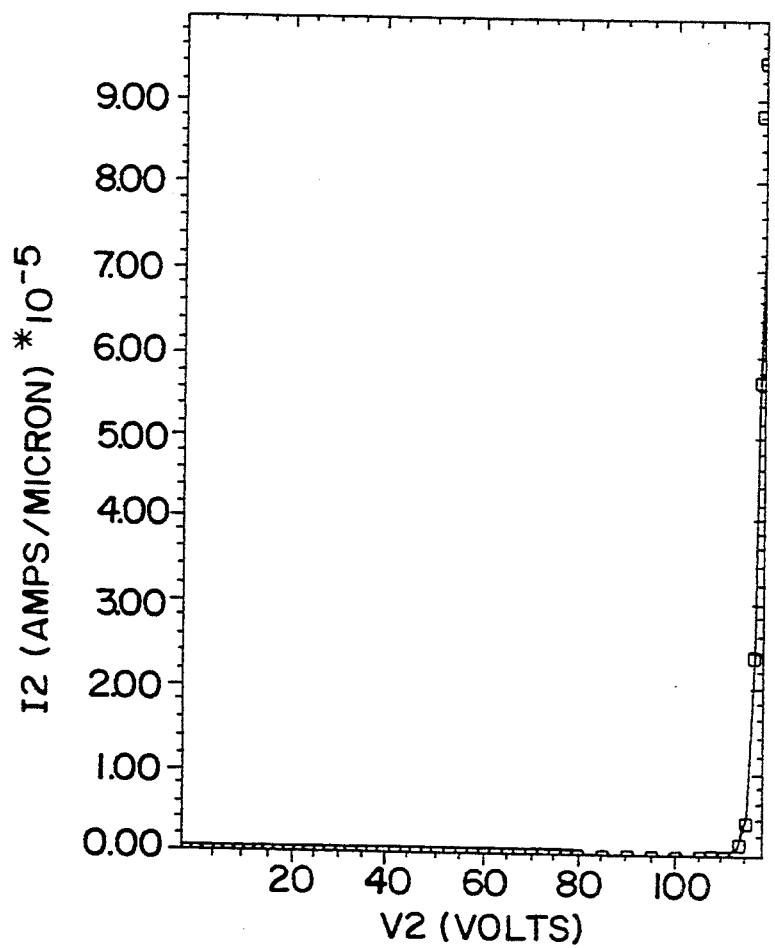
FIG. 5 is a graph showing reverse blocking characteristics of a trench gate lateral MOSFET according to a preferred embodiment of the present invention.
Figure 7:
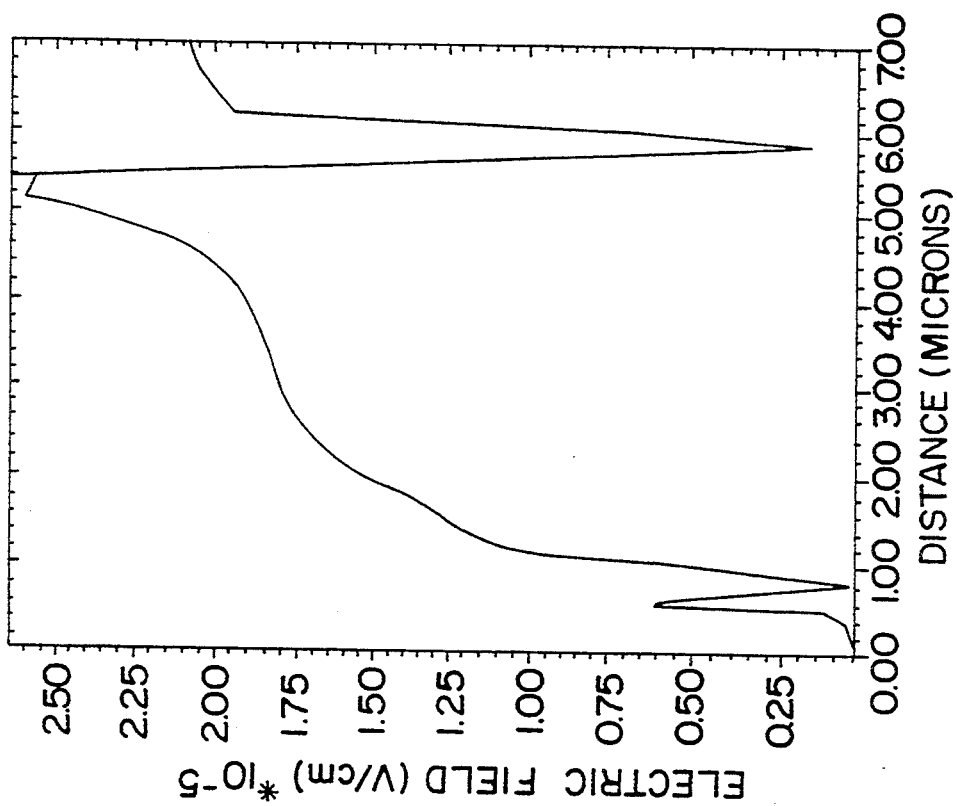
FIG. 7 is a graph showing an electric field profile to the left of the FIG. 2 trench.
Figure 6:
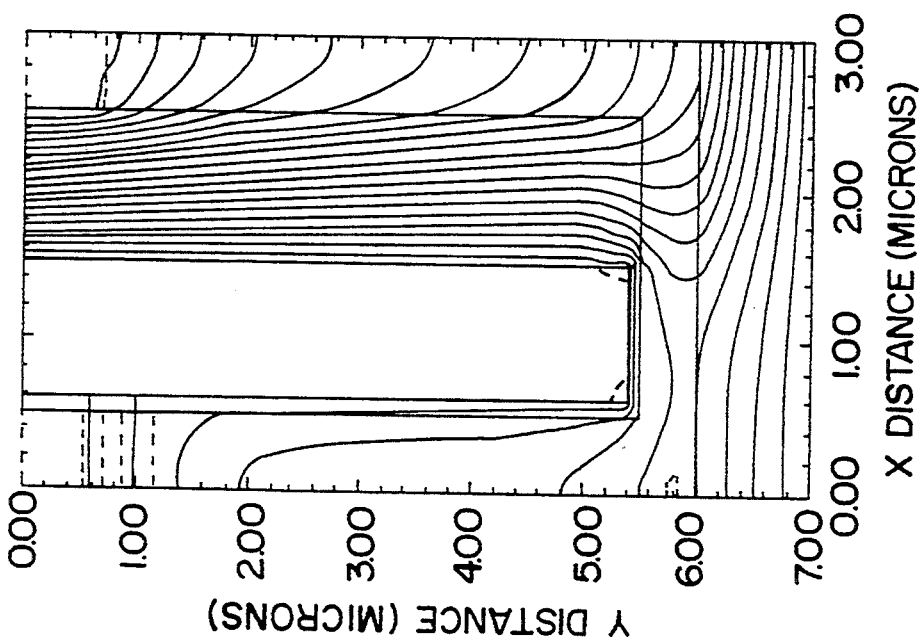
FIG. 6 is a graph showing the potential distribution at a drain bias of 100 volts in the trench gate lateral MOS- FET according to a preferred embodiment of the invention.
Figure 9:
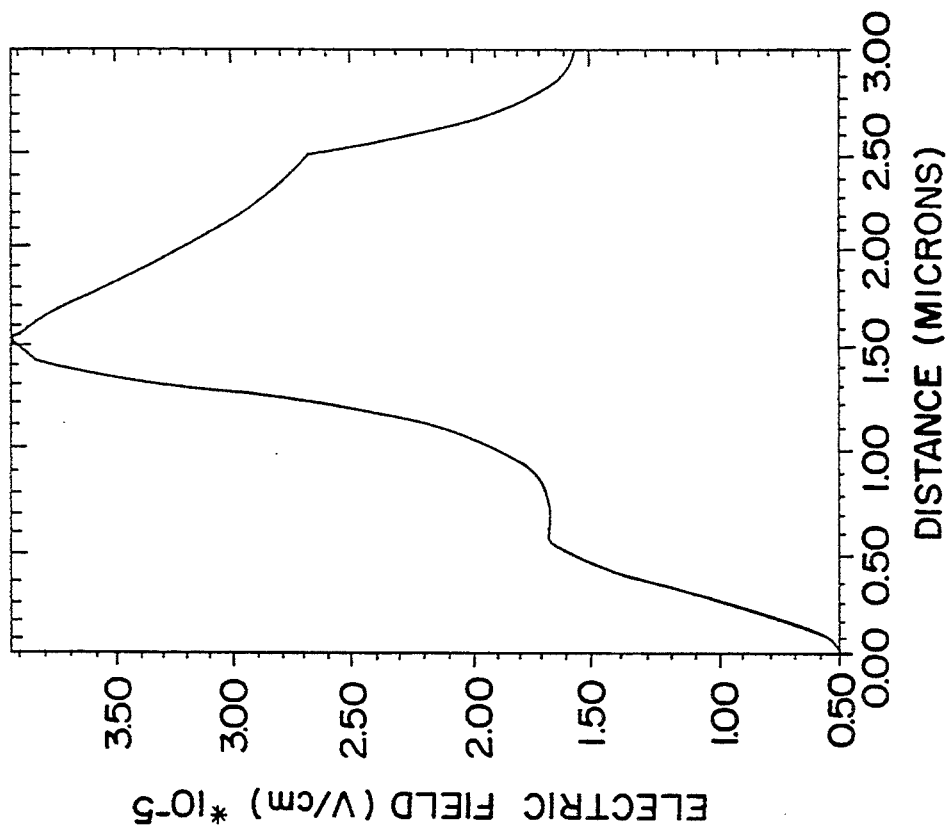
FIG. 9 is a graph showing an electric field profile below the FIG. 2 trench.
Figure 8:
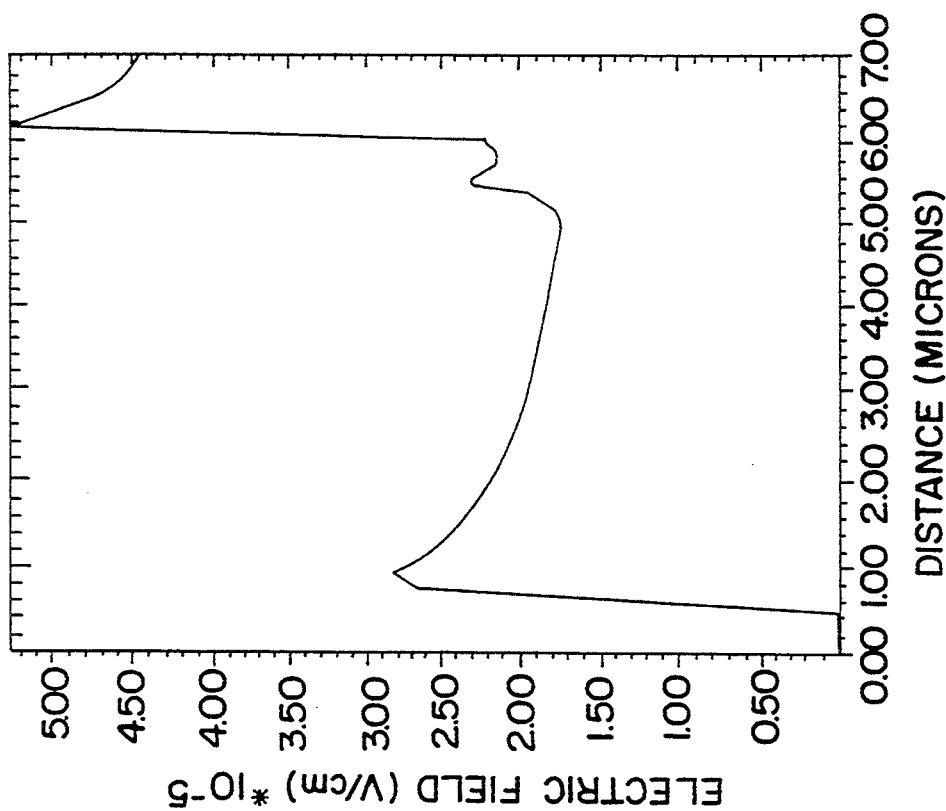
FIG. 8 is a graph showing an electric field profile to the right of the FIG. 2 trench.

It was found that a breakdown voltage of 120 volts could be obtained even when the doping concentration in the N-drift layer 116 was $3 \times 10^{16}$ per cm$^2$, as shown by the reverse blocking characteristics of FIG. 5. The net drift region dopant charge in the N-drift layer 116 in the mesa portions was set at $1.5 \times 10^{12}$ per cm$^2$ using $W \times N_D$ as defined above and in FIG. 2. This allows depletion of the charge by the applied bias even though the doping concentration is very high. The potential distribution in the structure at a drain bias of 100 volts is shown in FIG. 6, and the electric field profiles along the walls of trench 119 is shown in FIGS. 7-9. Specifically, FIG. 7 shows the electric field along the y-direction at x=0.4 (that is, on the left side of the trench); FIG. 8 shows the electric field along the y-direction at x=2.6 (that is, on the right side of the trench); and FIG. 9 shows the electric field along the x-direction at y=5.6 (that is, on the bottom of the trench). (The x- and y-directions are shown in FIG. 6.) From FIGS. 7-9, it can be seen that a substantially uniform electric field is established in all portions of the structure, resulting in the high breakdown voltage of 120 volts.

Figure 11:
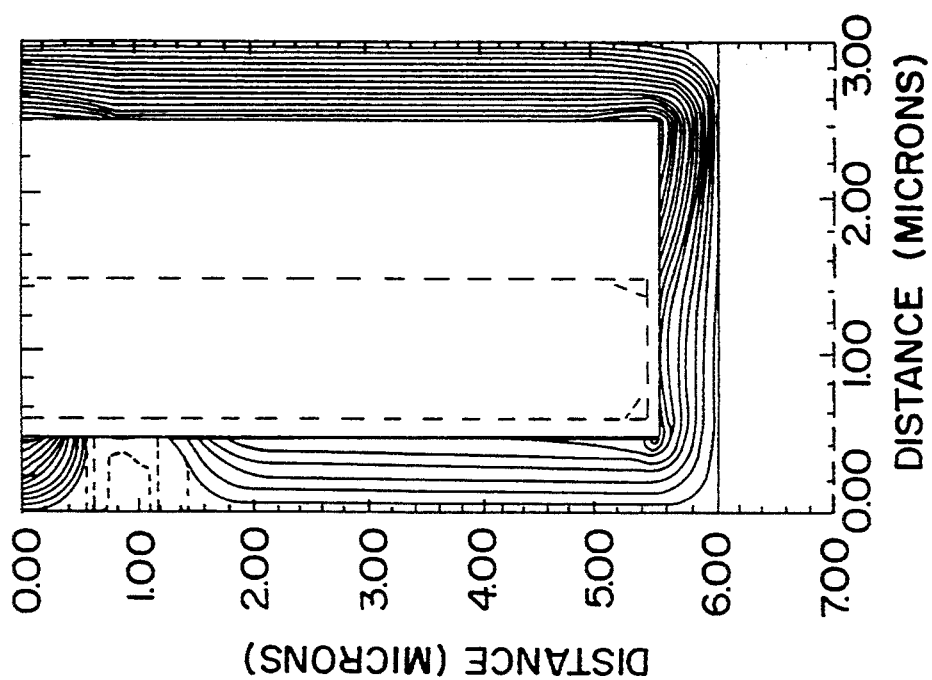
FIG. 11 is a graph showing current flow lines in a trench gate lateral MOSFET according to a preferred embodiment of the present invention.
Figure 10:
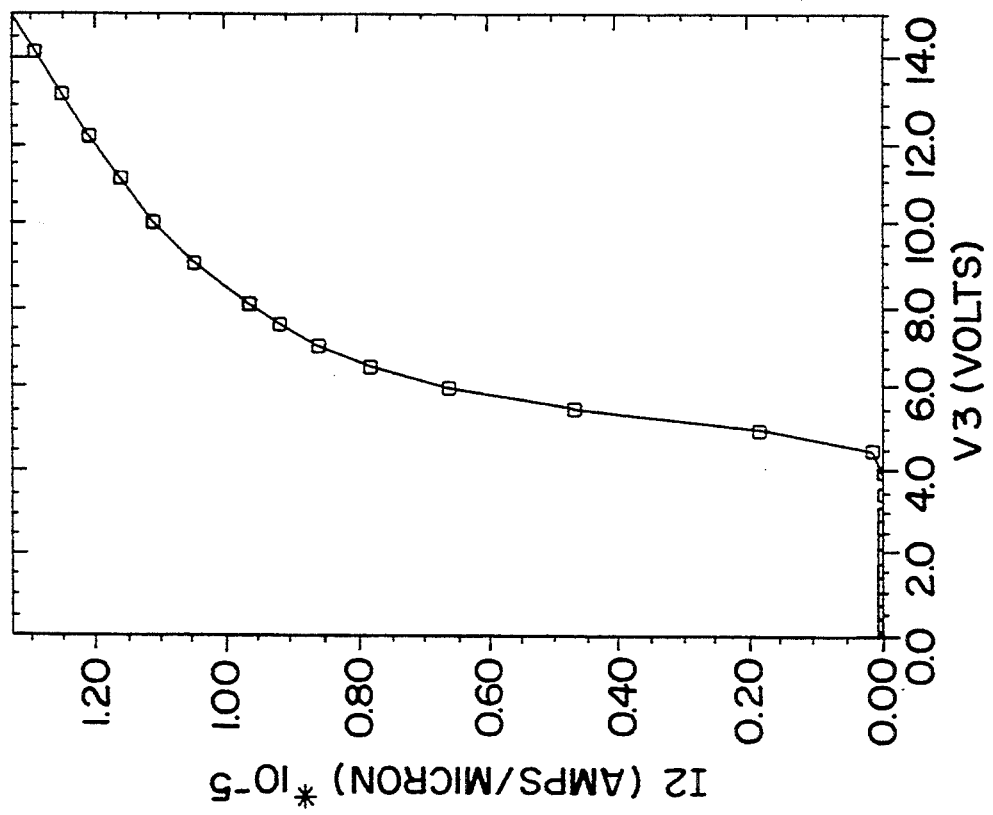
FIG. 10 is a graph showing transfer characteristics of a lateral trench gate MOSFET according to a preferred embodiment of the present invention.

The specific on-resistance of the device was obtained by simulating transfer characteristics. The characteristics are shown in FIG. 10 for a drain bias of 0.5 volts. From the drain current at a gate bias of 15 volts and using a cell pitch of 3 μm, the specific on-resistance is found to be 1.1 milliOhm-cm$^2$. This specific on-resistance is very close to that of the ideal specific on-resistance of a vertical power MOSFET with a breakdown voltage of 120 volts. The current flow lines in the on-state are shown in FIG. 11 to show the influence of the high N-drift layer doping concentration.

Figure 3:
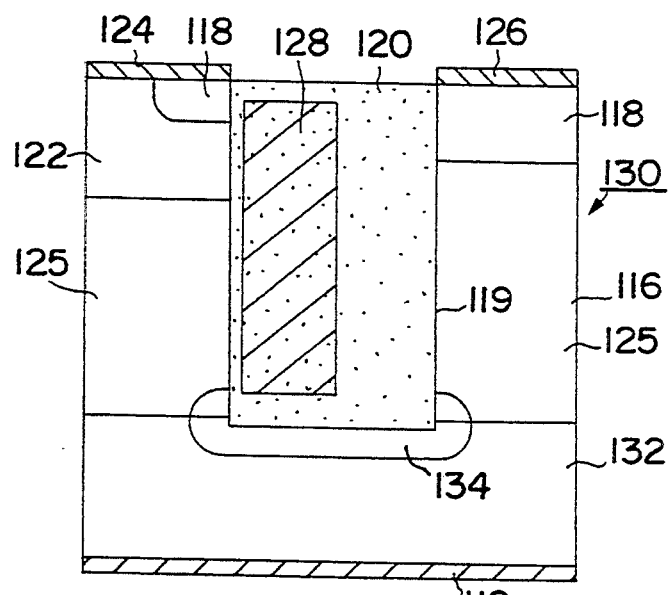
FIG. 3 is a cross-sectional view of the trench gate lateral MOSFET structure according to a second preferred embodiment of the present invention.

FIG. 3 is a cross-sectional view of a trench gate lateral MOSFET structure 130 according to a second preferred embodiment of the present invention. Elements having like reference numerals to FIG. 2 are identical and will not be further explained.

The trench gate lateral MOSFET structure shown in FIG. 3 is a junction isolated structure that also exhibits very low specific on-resistance at a high breakdown voltage. The structure includes an intermediate layer that is a P-layer 132 located on the substrate 112. The bottom of trench 119 extends within the P-layer 132. An N ion-implanted region 134 extends around the bottom of trench 119 in the P-layer 132 and along lower portions of the side walls of the trench 119 in the N-drift layer 116.

Figure 12:
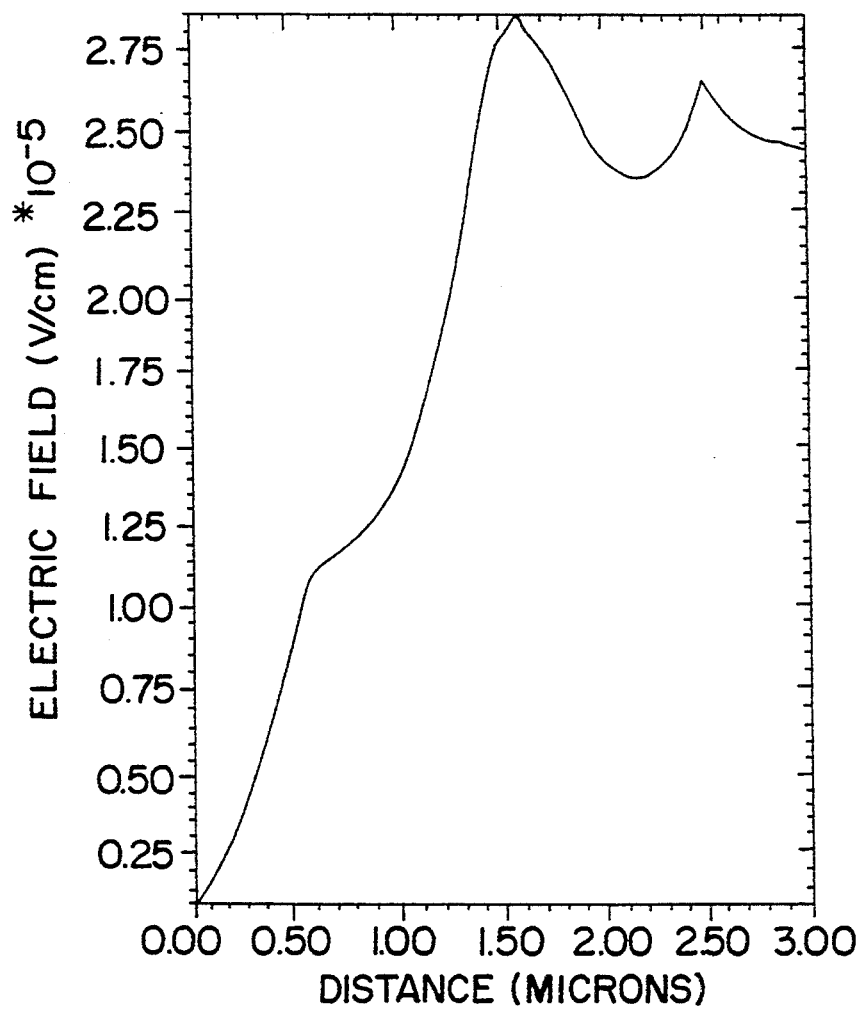
FIG. 12 is a graph showing an electric field profile along the bottom of the FIG. 3 trench.

The N ion-implanted region 134 was implanted at the bottom of trench 119 with a surface concentration of $5 \times 10^{16}$ per cm$^2$ and at a depth of 0.5 μm to obtain a net dopant charge of $1.5 \times 10^{12}$ cm$^{-2}$. The N ion-implanted region 134 creates a current flow path from drain to source and produces a substantially uniform electric field along the bottom of trench 119, as illustrated in FIG. 12, which shows the electric field distribution in the x-direction. The N-drift layer 116 can have a doping concentration as high as $3 \times 10^{16}$ per cm$^2$ to obtain a substantially uniform electric field along the right hand side of the trench below the drain contact 126. The breakdown voltage of MOSFET 130 was found to be 130 volts at a specific on-resistance of 1.2 milliOhm-cm$^2$. These values are similar to those for the dielectrically isolated structure described in conjunction with FIG. 2.

While the present invention has been described in accordance with preferred embodiments thereof, it is to be understood that many alternatives, variations and modifications will be evident to those skilled in the art. Accordingly, the preferred embodiments of this invention, as set forth herein, are intended to be illustrative, not limiting. Various changes may be made without departing from the spirit and scope of the invention, as defined in the following claims.

What is claimed is:

1. A trench gate lateral MOSFET, comprising:
   a substrate layer;
   an intermediate layer located on the substrate layer;
   an N-drift layer located on the intermediate layer;
   a P-base layer located on a first portion of the N-drift layer;
   an N+ layer located on at least part of the P-base layer and on a second portion of the N-drift layer;
   a trench located in the N-drift layer, the P-base layer and the N+ layer;
   an oxide region formed within the trench;
   a gate region located within the oxide region;
   a source contact located on the P-base layer and the N+ layer on a first side of the trench and extending to a first edge of the trench; and
   a drain contact located on the N+ layer on a second side of the trench and extending to a second edge of the trench, the source and drain contacts being located on a side of the N+ layer opposite from said substrate layer and the P-base layer being located only on the first side of the trench.

2. The trench gate lateral MOSFET of claim 1, wherein said intermediate layer comprises an isolating oxide layer so that said MOSFET is a dielectrically isolated type MOSFET.

3. The trench gate lateral MOSFET of claim 1, wherein said intermediate layer comprises a P-layer so that said MOSFET is a junction isolated type MOSFET.

4. The trench gate lateral MOSFET of claim 1, wherein the gate region is located within the oxide region closer to the first side of the trench than to the second side of the trench.

5. The trench gate lateral MOSFET of claim 1, wherein mesa regions located between the source contact and the intermediate layer and between the drain contact and the intermediate layer have a thickness measured perpendicular to sidewalls of the trench selected to optimize coupling of charges within the N-drift layer to the gate region along the sidewalls to produce a substantially uniform electric field along the mesa regions.

6. The trench gate lateral MOSFET of claim 1, wherein an isolating portion of the N-drift layer extending between a bottom surface of the trench and the intermediate layer has a thickness measured parallel to sidewalls of the trench selected to optimize coupling of charges within the isolating portion of the N-drift layer to the gate region along the bottom of the trench to produce a substantially uniform electric field along the bottom of the trench.

7. The trench gate lateral MOSFET of claim 1, wherein a cell pitch of said MOSFET is approximately 3 microns.

8. The trench gate lateral MOSFET of claim 1, wherein a specific on-resistance of said MOSFET is about 1.1 milliOhm-cm$^2$ at a breakdown voltage of 120 volts.

9. The trench gate lateral MOSFET of claim 3, wherein a bottom of said trench extends into the P-layer.

10. The trench gate lateral MOSFET of claim 9, further comprising a N ion-implanted region extending around the bottom of the trench in the P-region and along lower portions of sidewalls of the trench in the N-drift layer.

11. The trench gate lateral MOSFET of claim 10, wherein the N ion-implanted region is implanted with a surface concentration and depth selected to produce a substantially uniform electric field along the bottom of the trench.

12. The trench gate lateral MOSFET of claim 11, wherein a specific on-resistance of said MOSFET is 1.2 milliOhm-cm$^2$ at a breakdown voltage of 130 volts.

13. A trench gate lateral MOSFET, comprising:
    a substrate layer;
    an intermediate layer located on the substrate layer;
    an N-drift layer located on the intermediate layer;
    a P-base layer located on a first portion of the N-drift layer;
    an N+ layer located on at least a portion the P-base layer and on a second portion of the N-drift layer;
    a trench located in the N-drift layer, the P-base layer and the N+ layer;
    an oxide region formed within the trench;
    a gate region located within the oxide region;
    a source contact located on the P-base layer and the N+ layer on a first side of the trench and extending to a first edge of the trench; and
    a drain contact located on the N+ layer on a second side of the trench and extending to a second edge of the trench, the source and drain contacts being located on a side of the N+ layer opposite from said substrate layer, wherein mesa regions located between the source contact and the intermediate layer and between the drain contact and the intermediate layer have a dopant charge equal to a product of a width of the mesa regions measured perpendicular to sidewalls of the trench and doping concentrations of the mesa regions, the dopant charge selected to produce a substantially uniform electric field along the mesa regions and said MOSFET has a specific on-resistance of about 1.1 milliOhm-cm$^2$ and a breakdown voltage of about 120 volts.

14. The lateral trench gate MOSFET of claim 13, wherein the gate region extends within the N-drift layer.

15. The lateral trench gate MOSFET of claim 15, wherein the dopant charge in the mesa regions is between $1.0 \times 10^{12}$ cm$^{-2}$ and $2.0 \times 10^{12}$ cm$^{-2}$.

16. The lateral trench gate MOSFET of claim 13, wherein said intermediate layer comprises an isolating oxide layer so that said MOSFET is a dielectrically isolated type MOSFET.

17. The trench gate lateral MOSFET of claim 13, wherein said intermediate layer comprises a P-layer so that said MOSFET is a junction isolated type MOSFET.

18. The trench gate lateral MOSFET of claim 13, wherein an isolating portion of the N-drift layer extending between a bottom surface of the trench and the intermediate layer has a doping charge equal to a product of a thickness measured parallel to sidewalls of the trench and a doping concentration, the doping charge selected to optimize coupling of charges within the isolating portion of the N-drift layer to the gate electrode along the bottom of the trench to produce a substantially uniform electric field along the bottom of the trench.

19. The trench gate lateral MOSFET of claim 18, wherein the doping charge of the isolating portion of the N-drift layer is between $1.0 \times 10^{12}$ cm$^{-2}$ and $2.0 \times 10^{12}$ cm$^{-2}$.

20. The trench gate lateral MOSFET of claim 13, wherein a cell pitch of said MOSFET is approximately 3 microns.

21. A trench gate lateral MOSFET, comprising:
a substrate layer;
an intermediate layer located on the substrate layer;
an N-drift layer located on the intermediate layer;
a P-base layer located on a first portion of the N-drift layer;
a N+ layer located on at least a portion of the P-base layer and on a second portion of the N-drift layer;
a trench located in the N-drift layer, the P-base layer and the N+ layer;
an oxide region formed within the trench;
a gate region located within the oxide region;
an isolating portion of the N-drift layer extending between a bottom surface of the trench and the intermediate layer, the isolating portion having a dopant charge equal to a product of a doping concentration of the isolating portion and a thickness of the isolating portion measured parallel to sidewalls of the trench, the dopant charge being between $1.0 \times 10^{-12}$ cm$^{-2}$ and $2.0 \times 10^{12}$ cm$^{-2}$ so as to optimize coupling of charges within the isolating portion of the N-drift layer to the gate region along the bottom of the trench to produce a substantially uniform electric field along the bottom of the trench;
a source contact located on the P-base layer and the N+ layer on a first side of the trench and extending to a first edge of the trench;
a drain contact located on the N+ layer on a second side of the trench and extending to a second edge of the trench, the source and drain contacts being located on a side of the N+ layer opposite from said substrate layer; and
mesa regions located between the source contact and the intermediate layer and between the drain contact and the intermediate layer, said mesa regions having a doping charge equal to a product of a thickness of the mesa regions measured perpendicular to the sidewalls of the trench and a doping concentration of the mesa regions, the doping charge being in the range between $1.0 \times 10^{12}$ cm$^{-2}$ and $2.0 \times 10^{12}$ cm$^{-2}$ so as to produce a substantially uniform electric field along the mesa regions.

* * * * *